US005297618A

United States Patent [19]

Behun et al.

[11] Patent Number: 5,297,618
[45] Date of Patent: Mar. 29, 1994

[54] APPARATUS FOR REMOVING A HEATSINK FROM AN ELECTRONIC MODULE OR PACKAGE

[75] Inventors: John R. Behun, Poughkeepsie; Joseph A. Benenati, Hopewell Junction, both of N.Y.

[73] Assignee: International Business Machines Corporation, Armonk, N.Y.

[21] Appl. No.: 999,260

[22] Filed: Dec. 31, 1992

[51] Int. Cl.$^5$ ............................................. F28F 7/00
[52] U.S. Cl. ................... 165/80.3; 361/715; 361/705
[58] Field of Search .............. 165/80.3; 361/382, 383, 361/386, 387; 174/16.3; 251/713, 721, 722

[56] References Cited

U.S. PATENT DOCUMENTS

| | | | |
|---|---|---|---|
| 2,879,977 | 3/1959 | Trought | 257/718 |
| 3,476,177 | 11/1969 | Potzl | 165/80.3 |
| 4,069,497 | 1/1978 | Steidlitz | 361/386 |
| 4,342,068 | 7/1982 | Kling | 361/386 |
| 4,381,032 | 4/1983 | Cutchaw | 165/80.3 |
| 4,475,145 | 10/1984 | Heil et al. | 361/386 |
| 4,546,410 | 10/1985 | Kaufman | 361/387 |
| 4,698,663 | 10/1987 | Sugimoto et al. | 174/16.3 |
| 4,854,377 | 8/1989 | Komoto et al. | 165/80.4 |
| 5,018,004 | 5/1991 | Okinaga et al. | 361/383 |
| 5,019,940 | 5/1991 | Clemens | 165/80.3 |
| 5,089,936 | 2/1992 | Kojima et al. | 361/387 |
| 5,109,317 | 4/1992 | Miyamoto et al. | 165/80.3 |

OTHER PUBLICATIONS

Durand, R. D., "Ceramic Cap and Heat Sink for Semiconductor Package", IBM Tech. Disc. Bull., vol. 21, No. 3, Aug. 1978, p. 1064.
Kunkler et al., "Fixture for Assembling Heatsing Module", IBM Technical Disclosure Bulletin, vol. 23 No. 8, Jan. 1981, pp. 1064–1065.

Primary Examiner—John Rivell
Assistant Examiner—L. R. Leo
Attorney, Agent, or Firm—Whitham & Marhoefer

[57] ABSTRACT

A heatsink is provided which can be removably secured in a heat transfer relationship to an electronic module or package by an epoxy type adhesive. A screw is provided through one end of the heatsink directly over an edge of the module sealing cap. To remove the heatsink from the module, the screw is turned down to contact the cap. Continued turning causes a prying force between the cap and the module whereby the heatsink is peeled away and removed from the module. All forces are directed between the cap and the module thereby eliminating harmful stress from being transmitted through the solder ball connections and to a supporting circuit card.

13 Claims, 2 Drawing Sheets

APPARATUS FOR REMOVING A HEATSINK FROM AN ELECTRONIC MODULE OR PACKAGE

BACKGROUND OF THE INVENTION

1. Field of the Invention

The present invention generally relates to a method and apparatus for removing an adhesively attached heatsink from an electronic module or package.

2. Description of the Prior Art

Heat which is generated by electronic devices during the course of normal operation is typically dissipated into the ambient air before excessive levels can build and cause damage. More sophisticated packaged electronic devices typically comprise several chips in a single package. In this case, a fan or other means must be used to force air over the package to enhance cooling. The trend to compress more chips in a smaller space has lead to the development of multi-layered ceramic module technology which can incorporate numerous heat generating integrated circuit chips in a very confined sealed module. Consequently, these types of modules have particularly challenging cooling needs.

Multi-layered modules are typically mounted to a support card with a plurality of solder ball connections using surface mount array technology. Hence, these modules are sometimes referred to as solder ball connection (SBC) modules. Heat dissipation by conventional convection methods alone has proven inadequate for cooling electronic modules or packages (e.g., SBC modules, etc.) that have a plurality of chips arranged in rows and columns. Typically, the electronic module or package is sealed by a cap which protects the chips but seals in heat. To remedy this, a heat exchanger or heatsink device must be placed in thermal contact with the cap to conduct heat away from the electronic module or package and thereby facilitate cooling.

U.S. Pat. No. 4,854,377 to Komoto et al. discloses a heatsink attached with an epoxy adhesive to a low density integrated circuit package containing several chips. Heat generated by the chips during operation is conducted through the epoxy and is carried away from the module by cooling fluid within the heatsink and thereafter conducted into the ambient air. Epoxy attachment methods have proven superior to many other methods since it assures that the maximum surface areas of the module and the heat sink are in contact for maximum heat exchange.

Epoxy adhesives are substantially a permanent type of attachment method. This presents problems if for any reason a heatsink needs to be removed, such as, for example, when an electronic module or package needs to be repaired or modified, or if the heatsink has simply been initially misplaced on the module or package and needs to be repositioned. Prior art brute force removal methods entail torquing the heatsink with vice-grips while trying to hold the electronic module or package steady. Brute force methods, although sometimes successful, transmit a great deal of stress to the connection joints (e.g., solder balls, etc.) as well as the card. This harmful stress substantially decreases electronic module or package life expectancy and often causes immediate failure.

U.S. Pat. No. 4,381,032 to Cutchaw addresses the problem of removably attaching a heatsink to an electronic module or package by using screws to secure the edges of the two components together. The surface areas of the heatsink and module are not in direct contact, but rather, each chip in the top layer of the module has biased thereto a spring loaded piston which is thermally connected with the heatsink.

U.S. Pat. No. 5,089,936 to Kojima et al. provides a somewhat simplified method for removably attaching a heatsink to an electronic module wherein a heatsink is biased to the sealing cap of the module by a downwardly pressing spring clip. The spring clip and the heatsink are easily removed by loosening two screws securing the spring to jigs attached to the module housing. Although convenient for removal, this attachment method is far less efficient for heat transfer than epoxy attachment methods. The spring clip only applies pressure to the center of the heatsink and therefore the outer surface areas of the module and heatsink will not remain in perfect thermal contact throughout the entire operating and heating cycles of the module.

SUMMARY OF THE INVENTION

It is therefore an object of the present invention to provide a method and apparatus for safely removing an epoxy attached heatsink from an electronic module or package.

It is yet another object of the present invention to provide an epoxy attachable heatsink which will not transmit mechanical stress through an electronic module or package when it is removed.

According to the invention, a heatsink is provided with a flat bottom surface which can be secured in a heat transfer relationship to a cap of an electronic module or package by an epoxy-type adhesive. A vertically movable threaded screw is provided at one end of the heatsink. To remove the heatsink from the module, the screw is turned down to contact the top edge of the module cap. Continued turning will produce a prying force which causes the heatsink to peel away from the cap. All forces are directed between the cap and the heatsink thereby eliminating harmful stress to the solder ball connections and to a supporting circuit card.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
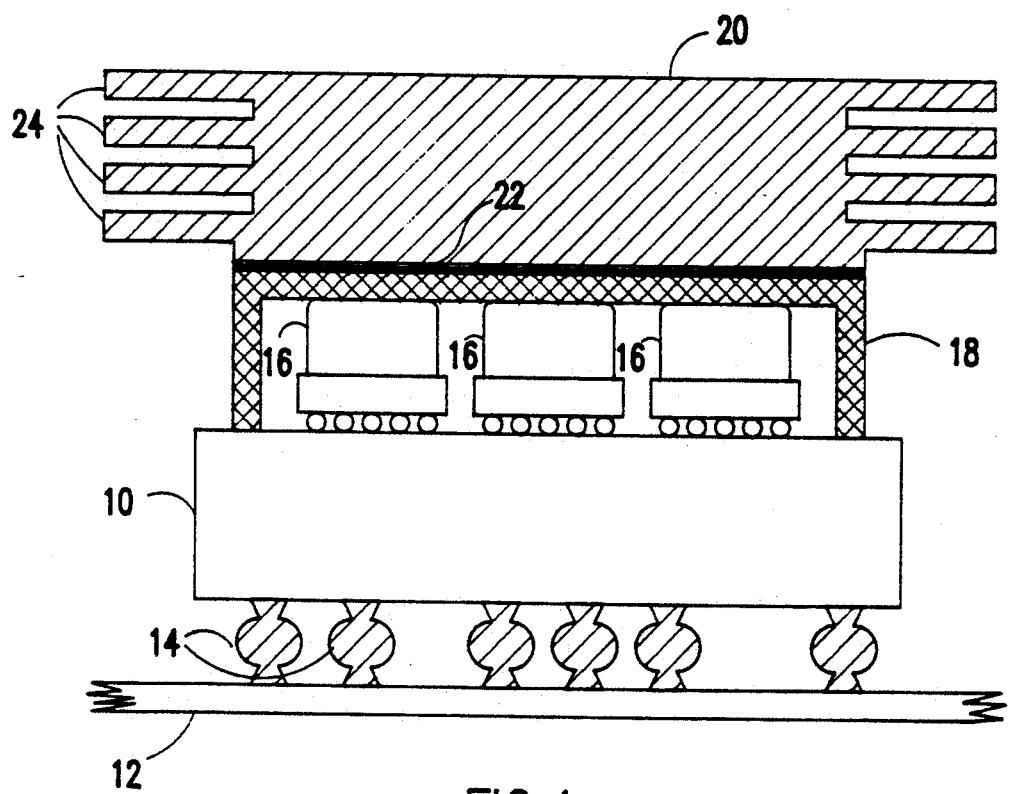
FIG. 1 is prior art showing a heatsink permanently attached to an electronic module or package with an epoxy-type adhesive.

Referring now to the drawings, and more particularly to FIG. 1, there is shown a prior art electronic module or package 10 which is electrically and mechanically connected to card 12 by a plurality of solder ball connection joints 14. The module or package 10 is of the type which are well known in the art and typically comprise numerous integrated circuit chips 16 arranged in square arrays within the module or package 10. A cap 18 fits over the top of the module or package 10 and seals the chips 16. A heatsink 20 is placed in thermal contact to the top of cap 18 and secured thereto with a layer of epoxy-type adhesive 22. During operation, heat generated by the chips 16 within the module or package 10 is transferred from the cap 18, through the epoxy layer 22 and into the heatsink 20. Conducting fins 24 are provided to facilitate heat dissipation into the atmosphere. As is evident from FIG. 1, any attempt to remove the heatsink 20 from the cap 18 will inevitably stress the solder joints 14 thereby causing great damage and immediate or eventual failure.

Figure 2A:
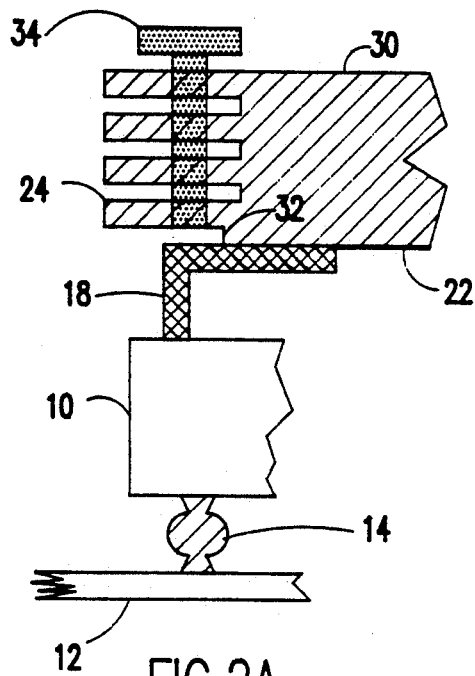
FIG. 2A is a sectional view of a heatsink removably attached to an electronic module or package with an epoxy-type adhesive according to the present invention.
Figure 2B:
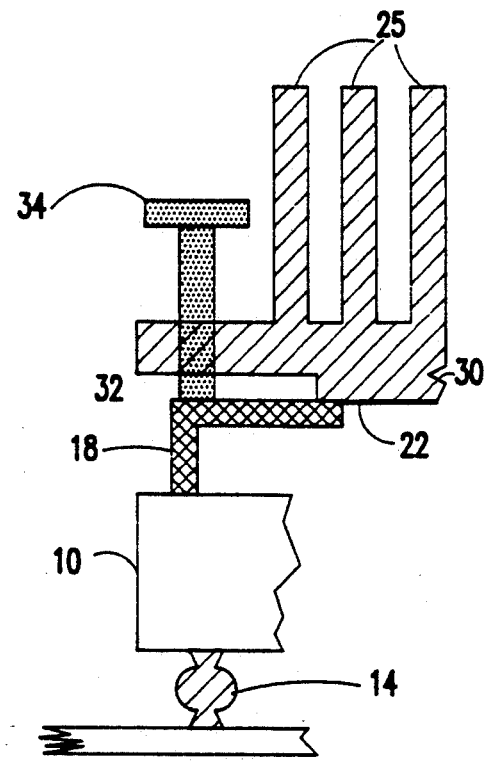
FIG. 2B is a sectional view showing a pin-fin heatsink having vertical fins.

Referring now to FIGS. 2A and 2B, there are shown heatsinks 30 modified according to the teaching of the present invention. The heatsink 30 has a flat bottom pedestal portion 32 which projects downward from the bottom of heatsink 30. The pedestal 32 is attached to a cap 18 of an electronic module or package 10 with a suitable thermally conductive adhesive epoxy layer 22. The surface area of the pedestal 32 is slightly less than that of the cap 18 such that a portion of the heatsink 30 is slightly cantilevered above the cap 18. A threaded screw 34 is downwardly threaded through the cantilevered portion of heatsink 30. FIG. 2A shows the screw 34 threaded through the radiating fins 24. FIG. 2B shows an alternate embodiment wherein a "pin-fin" heatsink having vertical heat conducting fins 25 is used.

Figure 3:
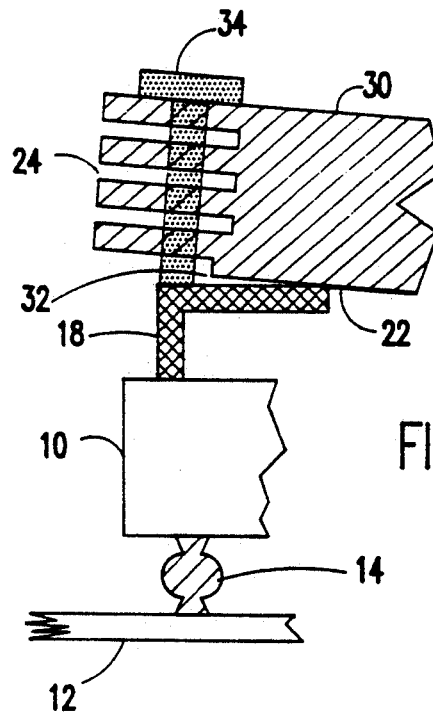
FIG. 3 is a sectional view of the heatsink of FIG. 2A showing the heatsink as it is being removed from the electronic module or package.

Referring now to FIG. 3, there is shown the heatsink of FIG. 2A as it is being removed from the module 10. The screw is turned downward until it contacts cap 18. As the screw continues to turn, it produces a prying action between the pedestal 32 and the cap 18 at the epoxy layer 22. Continued turning of the screw 34 will cause the epoxy layer 22 to fail and the heatsink 30 to completely peel away from the module 30. All forces are contained between the heatsink 30 and the cap 18, thereby eliminating the possibility of harmful stress transmissions to either the electronic module or package 10, the solder ball joint 14, or the card 12.

Other heat sink/fin designs can be used within the practice of this invention. The important features of this invention require that the heat sink have a pedestal portion connectable to an electronic module or package by an adhesive for efficient heat transfer therefrom, that a cantilevered portion extend from the pedestal portion, and that a means be provided to allow a prying action to be exerted at the cantilevered portion to cause separation of the heat sink from the electronic module or package without unduly stressing the solder ball connection joints 14. In some situations, it may be advantageous to use more than one cantilevered portion per heat sink to allow easier separation from the module. While FIGS. 2A, 2B, and 3 show the use of a screw 34 other means for applying a prying action without stressing solder ball connection joints on the module could also be employed (e.g., pneumatically driven push-rods, etc.).

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A removable heat sink for use on electronic modules or packages, comprising:

a heat sink body;
a pedestal connected to said heat sink body having a bonding surface suitable for adhesive bonding to an electronic module or package;
an adhesive positioned on said pedestal at said bonding surface;
at least one cantilevered portion extending from said pedestal; and
means for exerting a prying action on said heat sink body at said bonding surface of said pedestal, said means for exerting a prying action being connected to said cantilevered portion and being operable in a direction perpendicular to said bonding surface of said pedestal.

2. A removable heatsink as recited in claim 1 wherein said means for exerting said prying action is a screw which extends through said cantilevered portion.

3. A removable heatsink as recited in claim 1 wherein said means for exerting said prying action is a push rod which extends through said cantilevered portion.

4. A removable heatsink as recited in claim 1 further comprising cooling fins extending from said heat sink body.

5. A removable heatsink for use on electronic modules or packages, comprising:
a heat sink body;
a pedestal connected to said heat sink body having a bonding surface suitable for bonding to an electronic module or package;
at least one cantilevered portion extending from said pedestal;
cooling fins extending from said heat sink body; and
means for exerting a prying action on said heat sink body at said bonding surface of said pedestal, said means exerting a prying action being connected to said cantilevered portion and being operable in a direction perpendicular to said bonding surface of said pedestal, said means for exerting said prying action extends through said cooling fins and said cantilevered portion.

6. An electronic component, comprising:
an electronic module or package;
a heat sink comprising
a heat sink body,
a pedestal connected to said heat sink body having a bonding surface suitable for adhesive bonding to said electronic module or package,
at least one cantilevered portion extending from said pedestal, and means for exerting a prying action on said heat sink body at said boding surface of said pedestal, said means for exerting a prying action being connected to said cantilevered portion and being operable in a direction perpendicular to said bonding surface of said pedestal;
an adhesive positioned on said bonding surface of said pedestal connecting said heat sink to said to said electronic module or package;
cooling fins extending from said heat sink body, said means for exerting said prying action extends through said cooling fins and said cantilevered portion.

7. An electronic component, comprising:
an electronic module or package;
a heat sink comprising
a heat sink body,
a pedestal connected to said heat sink body having a bonding surface suitable for adhesive bonding to said electronic module or package, at least one cantilevered portion extending from said pedestal, and means for exerting a prying action on said heat sink body at said bonding surface of said pedestal, said means for exerting a prying action being connected to said cantilevered portion and being operable in a direction perpendicular to said bonding surface of said pedestal; and an adhesive positioned on said bonding surface of said pedestal connecting said heat sink to said electronic module or package.

8. An electronic component as recited in claim 7 wherein said means for exerting a prying action contacts said electronic module or package during prying.

9. An electronic component as recited in claim 7 wherein said means for exerting said prying action is a screw which extends through said cantilevered portion.

10. An electronic component as recited in claim 7 wherein said means for exerting said prying action is a push rod which extends through said cantilevered portion.

11. An electronic component as recited in claim 7 further comprising cooling fins extending from said heat sink body.

12. An electronic component as recited in claim 7 wherein said adhesive is an epoxy.

13. An electronic component as recited in claim 7 wherein said electronic module or package is a solder ball connection module.

* * * * *